US008576586B2

(12) United States Patent
Zheng et al.

(10) Patent No.: US 8,576,586 B2
(45) Date of Patent: Nov. 5, 2013

(54) DYNAMIC DRIVE OF SWITCHING TRANSISTOR OF SWITCHING POWER CONVERTER

(75) Inventors: Junjie Zheng, Santa Clara, CA (US); Jun Zheng, Shenzhen (CN); Andrew Kwok-Cheung Lee, Santa Clara, CA (US); John William Kesterson, San Jose, CA (US); Allan Ming-Lun Lin, Pleasanton, CA (US); Hien Huu Bui, San Jose, CA (US); Carrie Seim, Campbell, CA (US); Yong Li, Campbell, CA (US)

(73) Assignee: iWatt Inc., Campbell, CA (US)

( * ) Notice: Subject to any disclaimer, the term of this patent is extended or adjusted under 35 U.S.C. 154(b) by 0 days.

(21) Appl. No.: 12/678,690

(22) PCT Filed: Sep. 28, 2007

(86) PCT No.: PCT/CN2007/002846

§ 371 (c)(1),
(2), (4) Date: Mar. 17, 2010

(87) PCT Pub. No.: WO2009/039684

PCT Pub. Date: Apr. 2, 2009

(65) Prior Publication Data

US 2010/0202165 A1 Aug. 12, 2010

(51) Int. Cl.
*H02M 3/335* (2006.01)
*H02M 3/337* (2006.01)
*H02M 3/338* (2006.01)

(52) U.S. Cl.
USPC ................... 363/21.13; 363/21.17; 363/21.18

(58) Field of Classification Search
USPC ............... 363/20, 21.01, 21.12, 21.13, 21.15, 363/21.17, 21.18
See application file for complete search history.

(56) References Cited

U.S. PATENT DOCUMENTS

| | | | | |
|---|---|---|---|---|
| 4,471,418 | A * | 9/1984 | Tuma | 363/21.07 |
| 5,049,787 | A | 9/1991 | Nilssen | |
| 5,841,643 | A * | 11/1998 | Schenkel | 363/21.13 |
| 6,005,362 | A | 12/1999 | Enjeti et al. | |
| 6,944,034 | B1 | 9/2005 | Shteynberg et al. | |
| 7,057,907 | B2 * | 6/2006 | Oh | 363/21.05 |

FOREIGN PATENT DOCUMENTS

| | | | |
|---|---|---|---|
| CN | 200944559 | Y | 9/2007 |
| JP | 1-194867 | A | 8/1989 |
| JP | 2004-173459 | | 6/2004 |

OTHER PUBLICATIONS

PCT International Search Report and Written Opinion, PCT Application No. PCT/CN2007/002846, Jul. 10, 2008, 9 pages.
State Intellectual Property Office of the People's Republic of China, First Office Action, Chinese Patent Application No. 200780100842.2, Jan. 15, 2013, ten pages.

* cited by examiner

*Primary Examiner* — Adolf Berhane
*Assistant Examiner* — Nusrat Quddus
(74) *Attorney, Agent, or Firm* — Fenwick & West LLP

(57) ABSTRACT

A switching power converter comprises a transformer (110), a switch (108) coupled to the transformer (110), and a switch controller (200) coupled to the switch (108) for generating a switch drive signal (207) to turn on or off the switch (108). The drive current of the switch drive signal (207) is adjusted dynamically according to line or load conditions within a switching cycle and/or over a plurality of switching cycles. The magnitude of the drive current can be dynamically adjusted within a switching cycle and/or over a plurality of switching cycles, in addition to the pulse widths or pulse frequencies of the drive current.

23 Claims, 8 Drawing Sheets

DYNAMIC DRIVE OF SWITCHING TRANSISTOR OF SWITCHING POWER CONVERTER

BACKGROUND OF THE INVENTION

1. Field of the Invention

The present invention relates to a switching power converter and, more specifically, to dynamically driving the switching transistor of a switching power converter.

2. Description of the Related Arts

Switching power converters include a power stage for delivering electrical power from a power source to a load, a switching device in the power stage that electrically couples or decouples the load to or from the power source, and a switch controller coupled to the switch for controlling the on-times and off-times of the switching device. The switch is typically a MOSFET (Metal Oxide Semiconductor Field Effect Transistor) or a BJT (Bipolar Junction Transistor). A switch controller includes a pulse generator which generates a pulse for driving the switching transistor on or off. For example, the logic high and logic low parts of the pulse correspond to the on-times and off-times of the switching transistor. That is, the switching transistor is turned on while the pulse is in its logic high state and the switching transistor is turned off while the pulse is in its logic low state. The on-times and off-times of the switch can be modified by the switch controller based upon a feedback signal representing the output power, output voltage or output current.

FIG. 1A conceptually illustrates a conventional flyback type switching AC-DC power converter using a BJT 108 as the switching device. The power converter includes a transformer 110, a diode D1, a capacitor $C_O$, a BJT switch 108, a pulse generator 102, and a switch drive module 106. The pulse generator 110 generates the output drive signal 114 that drives the switch 108. The switch drive module 106 includes switches 112, 114. The switch drive module 106 shifts the voltage level of the logic level output drive pulses 104 to generate a switch drive signal 107 with a high voltage (+Vcc) suitable for driving the switch 106 on, when the output drive pulse 114 is at its logic high state, by turning the switch 112 on and the switch 114 off. The switch drive module 106 shifts the voltage level of the logic level output drive pulses 104 to generate a switch drive signal 107 with a low voltage (−Vdd) suitable for turning off the switch 106, when the output drive pulse 114 is at its low state, by turning the switch 112 off and the switch 114 on.

The rectified input AC power (DC) is stored in the transformer 110 while the switch 108 is turned on because the diode D1 becomes reverse biased. The rectified input AC power (DC) is then transferred to the load (not shown) across the capacitor $C_O$ while the switch 108 is turned off because the diode D1 becomes forward biased. Pulse Width Modulation (PWM) and Pulse Frequency Modulation (PFM) are conventional techniques used for controlling the switching power converters by controlling the widths or frequencies of the output drive pulse 114 driving the switch 108 to achieve output power regulation. For example, the width of the output drive pulse 114 in the PWM control scheme is regulated by the pulse generator 102 to achieve load and line regulation and output voltage ripple regulation.

As mentioned above, the switching device in the switching power converter may be a MOSFET or a BJT, which is typically a silicon semiconductor device. When the switching device is a MOSFET, the pulse generator can directly apply the +Vcc voltage to the gate of the MOSFET during the on-time, and the gate of the MOSFET is short to ground or −Vdd during the off-time. Such output drive is relative simple.

However, when the switching device is a BJT 108 as shown in FIG. 1, it is undesirable to apply the +Vcc directly to the base of the BJT 108, since the BJT 108 is a current-drive device. The base-emitter junction of the BJT 108 should be forward biased by approximately 0.6 V in order for the BJT 108 to function properly. One of the important properties of the BJT 108 is that its small base current $I_B$ controls the amount of the much larger collector current $I_C$, i.e., where $I_C=\beta\times I_B$, where β is a current amplification factor dependent on the physical properties of the BJT 108. Typical values of the β range for a power BJT is from 5 to 50.

The BJT switching device 108 typically has major turn-on and turn-off delay. The BJT has long turn-off time due to its long storage time. Normally, if $$I_B < \frac{I_C}{\beta},$$

the BJT 108 operates in the active range, or the BJT 108 cannot fully turn on. If $$I_B > \frac{I_C}{\beta},$$

the BJT 108 operates in the deep saturation range, and the turn-off time is longer. Ideally, the base drive current $I_B$ should be proportional to the collector current $I_C$.

FIG. 1B illustrates an ideal relationship between the base current and the collector current of a BJT switch in a switching power converter. In a flyback type switching power converter, the collector current $I_C$ has a positive slop 120. The magnitude of the positive slope 120 varies with the output load and input voltage conditions. Note that if the base drive current $I_B$ is too high, the turn-on will be very fast, but it causes high initial turn-on current spike 118. This spike 118 generates harmonic current, and causes EMI (Electro-Magnetic Interference).

Therefore, what is needed is a technique for effectively controlling the output drive (current or voltage) of a switching device of a switching power converter to reduce the turn-on and turn-off time of the switching device and control initial current spike. There is also a need for a technique for effectively controlling the output drive current of a BJT switching device so that a proportional relation between the base current and the collector current of the BJT switching device is maintained in a variety of operation conditions.

SUMMARY OF THE INVENTION

Embodiments of the present invention include a switching power converter in which the drive current or the drive voltage of the switch is adjusted dynamically according to line or load conditions within a switching cycle and/or over a plurality of switching cycles. The magnitude of the switch drive current or the switch drive voltage can be dynamically adjusted within a switching cycle and/or over a plurality of switching cycles, in addition to adjusting the pulse widths or pulse frequencies of the switch drive current or voltage.

In one embodiment, a switching power converter comprises a transformer coupled between a power source and a load, a switch coupled to the transformer for coupling or decoupling the load to or from the power source through the transformer, and a switch controller coupled to the switch and generating a switch drive signal for turning on or off the switch, where the switch controller dynamically adjusts the magnitude of the switch drive signal within a switching cycle of the switching power converter. The switch drive signal may be a current signal or a voltage signal. The switch controller includes a pulse generator generating an output drive signal at a first logic state during a first part of the switching cycle and a second logic state during a second part of the switching cycle, and a dynamic switch drive module receiving the output drive signal and dynamically adjusting the magnitude of the switch drive signal.

In one embodiment, the dynamic switch drive module adjusts the magnitude of the switch drive signal to be at a predetermined level for a predetermined period of time at a beginning of the first part of the switching cycle. Such predetermined period of time may be fixed according to device characteristics of one or more components of the switching power converter.

In another embodiment, the switch is a bipolar junction transistor and the switch drive signal is a base current of the bipolar junction transistor. And, the dynamic switch drive module adjusts the magnitude of the base current to be substantially proportional to the emitter current of the bipolar junction transistor. The magnitude of the switch drive current signal may be adjusted based on the input voltage to the switching power converter and the load of the switching power converter.

In still another embodiment, the dynamic switch drive module adjusts the magnitude of the switch drive signal to be zero for a predetermined period of time at the end of the first part of the switching cycle. Such predetermined period of time during which the switch drive signal is zero is determined based on the input voltage to the switching power converter and the load of the switching power converter.

In one embodiment, the dynamic switch drive module comprises a switch drive control signal generator generating a digital switch drive control signal that is dynamically adjusted within the switching cycle, and a switch multiplex receiving a plurality of reference current inputs and generating the switch drive signal as a current signal, where the magnitude of the switch drive current signal corresponds to the magnitude of the digital switch drive control signal. The plurality of reference current inputs include different weighted magnitudes of a reference current, which can be determined by a single resistor.

In still another embodiment, the switch is a bipolar junction transistor and the switch drive signal is a base current of the bipolar junction transistor, and the switching power converter further comprises another transistor coupled to the base of the bipolar junction transistor. This another transistor is configured to be turned on while the bipolar junction transistor is turned off, in order to provide a rapid discharge path for the charges on the base of the bipolar junction transistor.

In still another embodiment, the switch controller also adjusts the duration during which the switch is turned on within the switching cycle, in addition to dynamically adjusting the magnitude of the switch drive signal within the switching cycle. Furthermore, the switch controller dynamically adjusts the magnitude of the switch drive signal over a plurality of switching cycles, for example, over the switching cycle and a subsequent switching cycle of the switching power converter.

The dynamic switch drive circuitry of the present invention can control the gate/base drive capability of the switching device of a switching power converter dynamically, switching cycle by switching cycle and even within a switching cycle, according to the operating load / line conditions. Since the switch drive is dynamic, the number of components and the overall cost and the physical size required for the switching power converter can be reduced significantly. Since the magnitude (amplitude) of the switch drive signal can be controlled together with the pulse width (PWM) or the pulse frequency (PFM) of the switch drive signal, the characteristics of the switching devices come closer to an ideal switch.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

Figure (FIG. 1A conceptually illustrates a conventional flyback type switching AC-DC power converter using a BJT as the switching device.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

The present invention provides a variety of techniques to properly turn on and off the switching BJT of a switching power converter in order to bring the BJT closer to an ideal switch. The BJT is driven by a dynamic base current that is adjusted dynamically over the switching cycles and within each of the switching cycles of the switching power converter in order to maintain the base current and the collector current of the BJT to be substantially proportional to each other as much as possible and to control the initial turn-on spike current. A time-controlled and magnitude-controlled current pulse is dynamically supplied for turn-on of the BJT and a discharge path is dynamically provided to quickly turn-off the BJT. This aides in the overall design of the switching power supply architecture.

Figure 1A:
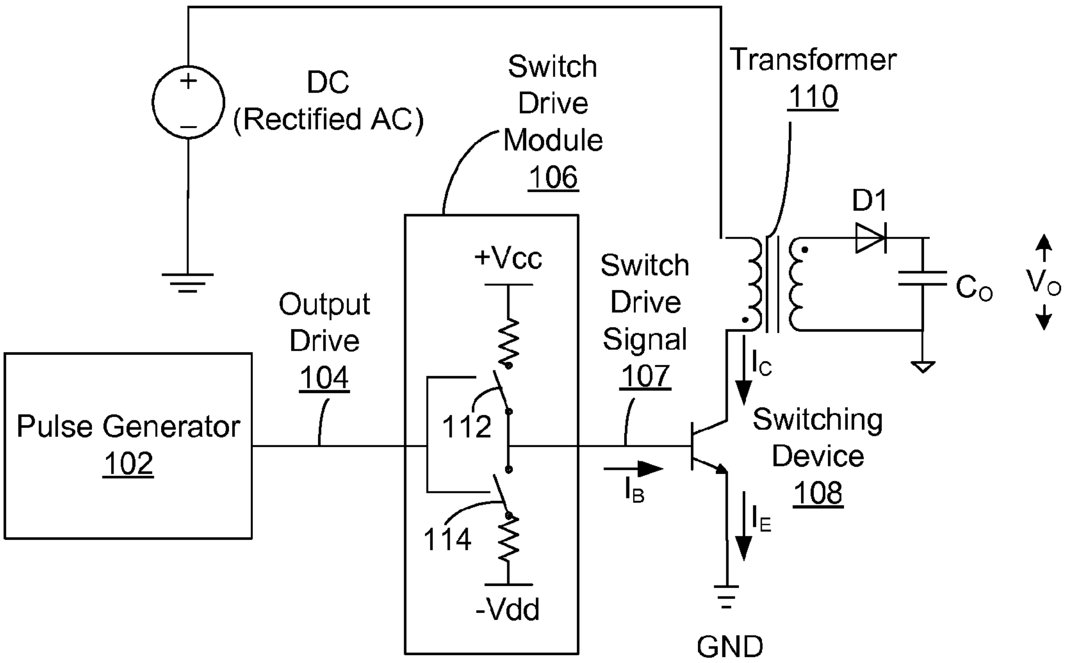
FIG. 1B illustrates an ideal relationship between the base current and the collector current of a BJT switch in a switching power converter.
Figure 1B:
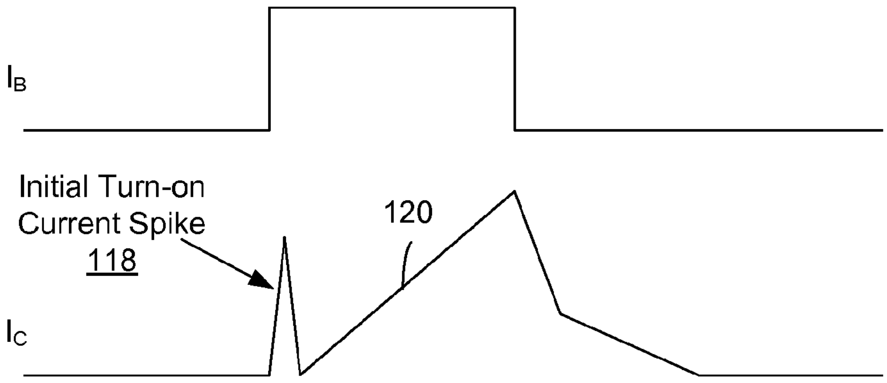
Figure 2:
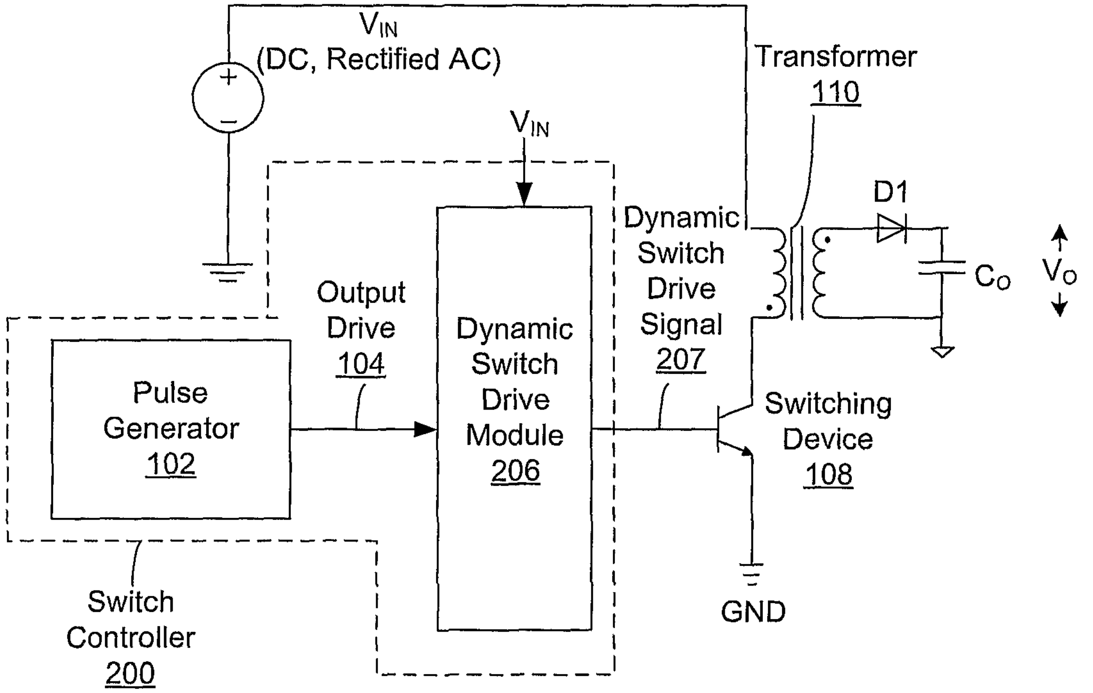
FIG. 2 conceptually illustrates a flyback type switching AC-DC power converter using a BJT as the switching device driven by a dynamic switch drive signal, according to one embodiment of the present invention.

FIG. 2 conceptually illustrates a flyback type switching AC-DC power converter using a BJT as the switching device driven by a dynamic switch drive signal, according to one embodiment of the present invention. The power converter includes a transformer 110, a diode D1, an output capacitor $C_O$, a BJT switch 108, and a switch controller 200 including a pulse generator 102 and a dynamic switch drive module 206. The power converter receives AC power in rectified form (DC) (input voltage $V_{IN}$) and delivers DC power to a load (not shown) coupled across the output capacitor $C_O$.

The pulse generator 110 generates the output drive pulses 114 that drive the switch 108. The pulse widths of the high logic state and the low logic state of the output drive pulse 114 determine the periods during which the BJT switch 108 is on (on-time) and off (off-time), respectively.

The rectified AC power (DC) is stored in the transformer 110 while the switch 108 is on because the diode D1 becomes reverse biased. The rectified AC power (DC) is then transferred to the load (not shown) across the output capacitor $C_O$ while the switch 108 is off because the diode D1 becomes forward biased. Pulse Width Modulation (PWM) and Pulse Frequency Modulation (PFM) are conventional techniques used for controlling the switching power converters by controlling the widths or frequencies of the output drive pulse 114 driving the switch 108 to achieve output power regulation. For example, the width of the output drive pulse 114 in the PWM control scheme is regulated by the pulse generator 102 to achieve load and line regulation and output voltage ripple regulation.

The dynamic switch drive module 206 receives the output drive signal 104 and the input voltage $V_{IN}$, and generates a dynamic switch drive signal 207 for supplying current to drive the BJT switch 108. The dynamic switch drive module 206 does not change the intended on-time and intended off-time of the BJT 108 as indicated by the output drive pulse 104. However, as will be explained in more detail with reference to FIGS. 3, 4, and 5, the magnitude of the dynamic switch drive signal 207, i.e., the base drive current, is dynamically adjusted, switching cycle by switching cycle and even within a switching cycle, so that the relation between the base current and the collector current of the BJT 108 is substantially proportional to each other as much as possible and the switching device 108 is turned off quickly when the output drive 104 transitions from a high logic state to a low logic state. As will be explained in more detail with reference to FIG. 5, the dynamic switch drive signal 207 provides a positive base drive current most of the time during which the output drive signal 104 is at the high logic level (intended on-time of the switch 108). The dynamic switch drive module 207 also provides a discharge path to discharge the base of the BJT 108 while the output drive signal is at the low logic level (intended off-time of the switch 108).

Figure 3:
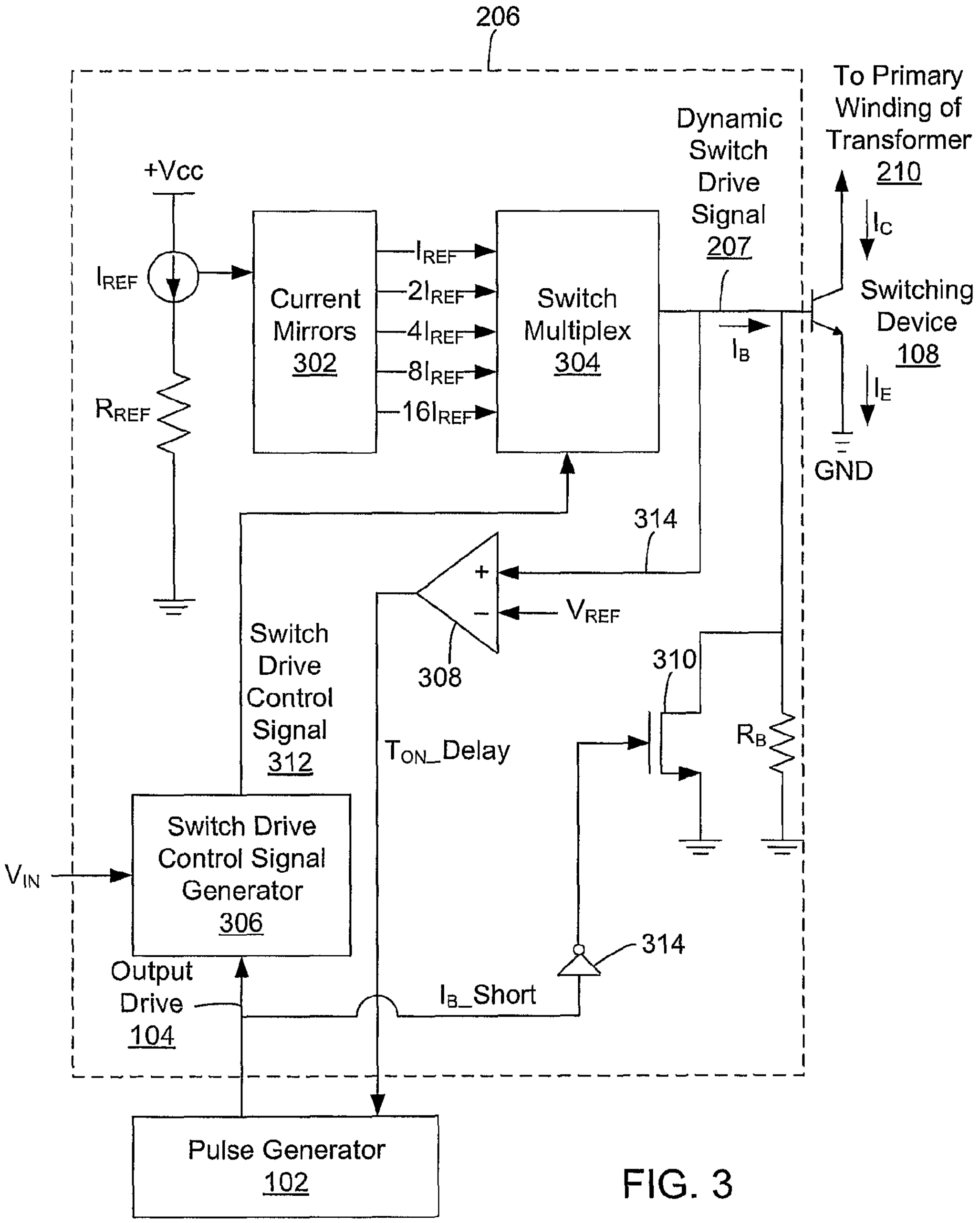
FIG. 3 illustrates the dynamic switch drive module of FIG. 2 in more detail, according to one embodiment of the present invention.

FIG. 3 illustrates the dynamic switch drive module 206 of FIG. 2 in more detail, according to one embodiment of the present invention. The dynamic switch drive module 206 includes a reference current source $I_{REF}$ and a resistor $R_{REF}$, current mirrors 302, a switch multiplex 304, a switch drive control signal generator 306, a comparator 308, an inverter 314, a discharge switch 310, and a resistor $R_B$. The resistor $R_{REF}$ may be an external resistor or an internal resistor.

The supply voltage +Vcc is applied across the resistor $R_{REF}$ and the current source to generate a reference current $I_{REF}$. By adjusting the resistance of the single resistor $R_{REF}$, the reference current $I_{REF}$ can be conveniently adjusted. The current mirrors 302 include a plurality of pairs of current mirrors, in this example 5 pairs of current mirrors, that repeat the reference current $I_{REF}$ and provide different weighted amounts of current, $I_{REF}$, $2I_{REF}$, $4I_{REF}$, $8I_{REF}$, $16I_{REF}$ in this example, to the switch multiplex 304. The 5 bit switch multiplex 304 is controlled by the 5 bit switch drive control signal 312 [4:0] that is generated by the switch drive control signal generator 306. Under control of the switch drive control signal 312, the switch multiplex 304 dynamically generates the dynamic switch drive signal 207 (i.e., the base current). The magnitude of such base current $I_B$ is adjusted dynamically under control of the switch drive control signal 312, switching cycle by switching cycle and even within a switching cycle, as is explained in more detail with reference to FIGS. 4 and 5. The BJT switch 108 has emitter current $I_E$ and collector current $I_C$ that is controlled based on the magnitude of the base current $I_B$ (i.e., the dynamic switch drive signal 207).

The switch drive control signal generator 306 receives the input voltage $V_{IN}$ (rectified AC) and the output drive signal 104 (including the intended on-time period $T_{ON}$ of the switch 108), and based on that information dynamically generates the 5 bit switch drive control signal 312 to control the base drive current $I_B$ (dynamic switch drive signal 207). The switch drive control signal 312 is dynamically adjusted, switching cycle by switching cycle and even within a single switching cycle, based on the input voltage $V_{IN}$ (rectified AC) and the intended on-time period $T_{ON}$ of the switch 108, as explained in more detail with reference to FIG. 5. Although the example herein uses a 5-bit switch drive control signal 312 to control a 5-bit switch multiplex 304, it should be noted that any number of bits may be used for the switch drive control signal 312 and the switch multiplex 304.

The inverter 314 inverts the logic level of the output drive signal 104 from the pulse generator 102 to generate the $I_B$_Short signal. Thus, when the output drive signal 104 is at logic high corresponding to the on-time of the switch 108, the $I_B$_Short signal is at a logic low and the n-type MOSFET 310 is off. However, when the output drive signal 104 is at logic low corresponding to the off-time of the switch 108, the $I_B$_Short signal is at a logic high and the n-type MOSFET 310 is turned on, providing a rapid discharge path for the charges in the base of the BJT switch 108 to discharge rapidly during the off-time of the switch 108. This enables the BJT switch 108 to turn off more quickly. Turning off the MOSFET 310 during the off-time of the BJT 108 also prevents the base of the BJT 108 from being at a floating state when the switch multiplex 304 does not provide current in the dynamic switch drive signal 207. The resistor $R_B$ (e.g., 50 KOhm) is provided to ensure that the base of the BJT 108 is pulled down even in case of a failure of $I_B$_Short or the MOSFET 310.

The comparator 308 receives the voltage 314 of the base of the BJT 108 and compares it against a reference voltage $V_{REF}$ (e.g., 75 mV) to generate a $T_{ON}$_Delay signal. The reference voltage $V_{REF}$ is chosen to be a voltage representing when the BJT 108 is effectively off. The $T_{ON}$_Delay signal is at logic high when the base voltage 314 is higher than the reference voltage $V_{REF}$, and at logic low when the base voltage 314 is drops lower than the reference voltage $V_{REF}$. The transition of the $T_{ON}$_Delay signal from logic high to logic low indicates when the BJT switch 108 was effectively turned off. Based on the $T_{ON}$_Delay signal, the pulse generator 102 can determine how much the BJT switch 108 was kept on longer than the intended on-time of the switch 108 as indicated by the output drive signal 104. Hence the name of the signal, $T_{ON}$_Delay. The pulse generator 102 can use this $T_{ON}$_Delay information to control the intended on-time of the switch 108, e.g., reduce the intended on-time or the current in the dynamic switch drive signal 207, if necessary.

Figure 4:
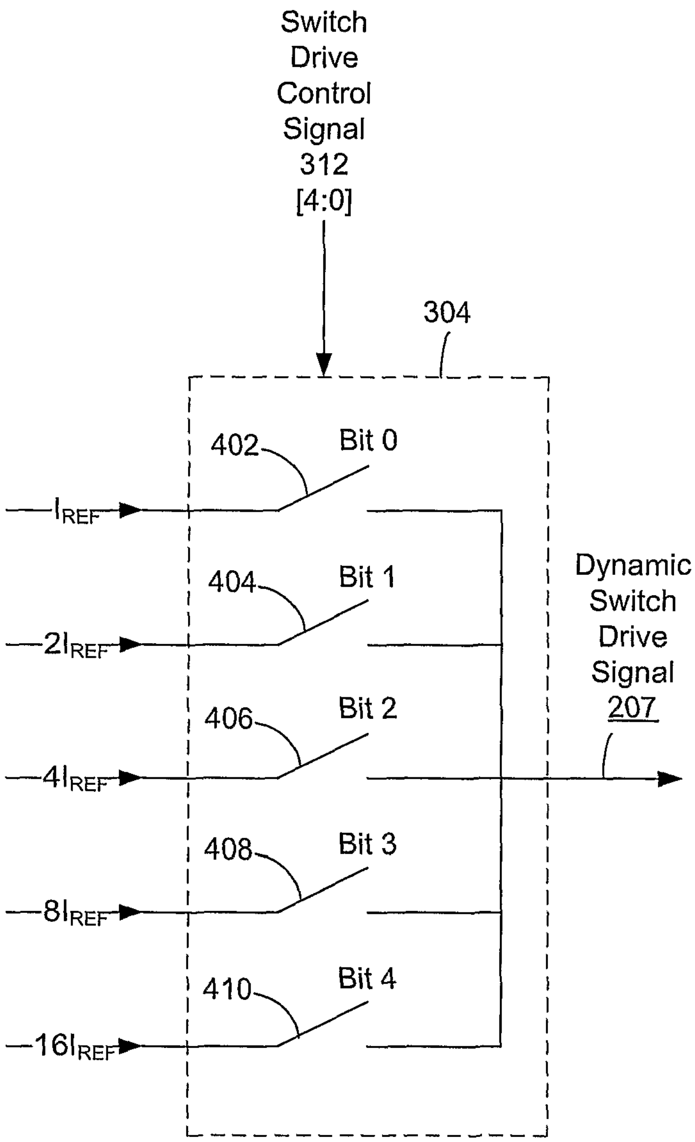
FIG. 4 illustrates the switch multiplex of FIG. 3 in more detail, according to one embodiment of the present invention.

FIG. 4 illustrates the switch multiplex 304 of FIG. 3 in more detail, according to one embodiment of the present invention. The switch multiplex 304 includes a plurality of switches 402, 404, 406, 408, 410, each coupled to the weighted current $I_{REF}$, $2I_{REF}$, $4I_{REF}$, $8I_{REF}$, $16I_{REF}$, respectively. The on (closing) and off (opening) of the switches 402, 404, 406, 408, 410 are controlled by bit 0, bit 1, bit 2, bit 3, and bit 4, respectively, of the switch drive control signal 312, for example, to be turned on when bit 0, bit 1, bit 2, bit 3, and bit 4 are logic high ("1") and off when bit 0, bit 1, bit 2, bit 3, and bit 4 are logic low ("0"). None, some or all of the current $I_{REF}$, $2I_{REF}$, $4I_{REF}$, $8I_{REF}$, $16I_{REF}$ are combined to generate the dynamic switch drive signal 207, depending upon which of the switches 402, 404, 406, 408, 410, respectively, is on or off. Thus, the switch drive control signal 312 can digitally control the magnitude of the current in the dynamic switch drive signal 207 for driving the base of the BJT 108.

Figure 5:
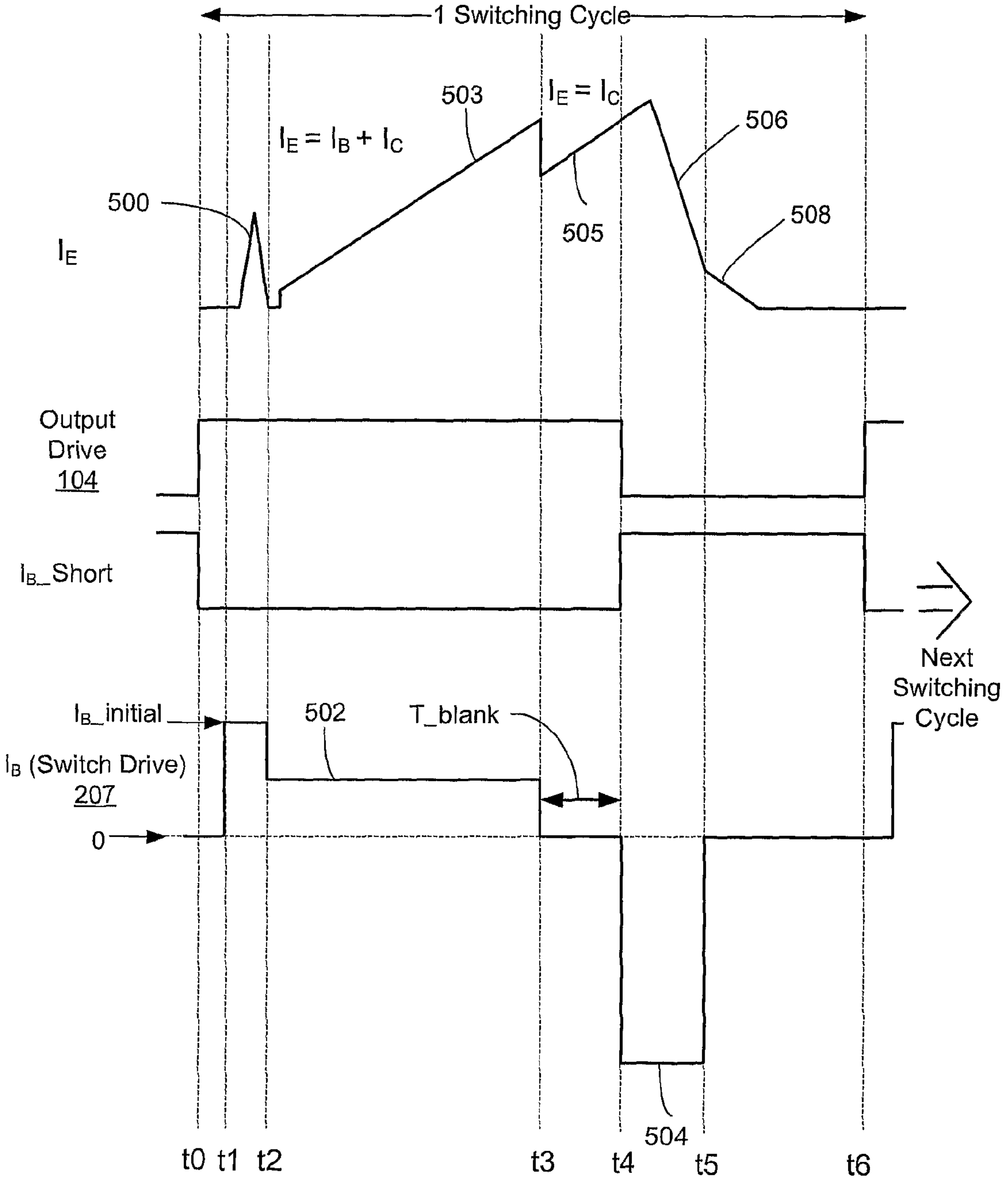
FIG. 5 is a timing diagram illustrating how the base current (dynamic switch drive signal) is dynamically controlled within a switching cycle and over multiple switching cycles, according to one embodiment of the present invention.

FIG. 5 is a timing diagram illustrating how the base current (dynamic switch drive signal) is dynamically controlled within a switching cycle, according to one embodiment of the present invention. The periods of t0 to t6 are in one switching cycle of the switching power converter. The output drive pulse 104 is at a logic high (on-time of the BJT switch 108) during t0 to t4 and at a logic low (off-time of the BJT switch 108) during t4 to t6.

There is a slight delay from t0 to t1 in providing the base current $I_B$ (switch drive signal 207) and thus there is no emitter current $I_E$ during t0 to t1. During the period of t1 to t2, the switch drive control signal 312 controls the base current $I_B$ (switch drive signal 207) to limit the initial spike current to a predetermined value, $I_B$_initial, for a fixed period t1 to t2. As a result, the initial spike emitter current is also limited 502. The period t1 to t2 is fixed as appropriate according to the device characteristics of the one or more components of the switching power converter.

From t2 to t3, the switch drive control signal 312 controls the base current $I_B$ (switch drive signal 207) to have a value 502 that is substantially proportional to the collector current $I_C$. The switch drive control signal generator 306 adjusts the digital value of the switch drive control signal 312 and thus the resulting the base current $I_B$ (switch drive signal 207) to be substantially proportional to the product of the input voltage $V_{IN}$ (rectified AC) to the switching power converter and the intended on-time period $T_{ON}$ of the switch 108. That is, the switch drive control signal 312 [4:0] is controlled to be substantially proportional to ($V_{IN}$×$T_{ON}$). $V_{IN}$ represents the line condition and $T_{ON}$ represents the load condition. The adjustment of the value of the switch drive control signal 312 [4:0] can be done even within one switching cycle during t2 to t3. This way, the base current $I_B$ (switch drive signal 207) can be substantially proportional to the collector current $I_C$. The emitter current $I_E$ 503 is equal to the sum of the base current $I_B$ and the collector current $I_C$.

From t3 to t4, the switch drive control signal 312 controls the base current $I_B$ (switch drive signal 207) to be substantially zero, during the time period T_blank. The time period T_blank is also referred to herein as "blank time." In this regard, the switch drive control signal generator 306 generates the switch drive control signal 312 to be zero in all 5 bits during t3 to t4. The switch drive control signal generator 306 controls the length of the time period between t3 and t4 (blank time) to be substantially proportional to ($V_{IN}$×$T_{ON}$). $V_{IN}$ represents the line condition and $T_{ON}$ represents the load condition. From t3 to t4, the emitter current $I_E$ 505 is substantially equal to collector current $I_C$. Therefore, the emitter current $I_E$ can be sensed to determine the actual current through the primary windings of the transformer 110, unskewed by the base current $I_B$, to implement current control of the switching power converter.

At t4, the output drive signal 104 transitions from logic high to logic low, and thus the $I_B$_Short signal transitions from logic low to logic high. This causes the MOSFET 310 (FIG. 3) to turn on. Thus, from t4 to t5, the base of the BJT switch 108 rapidly discharges through the MOSFET 310 and a large reverse base current $I_B$ 504 flows out of the base of the BJT switch 108. As a result, the emitter current 506 also drops significantly. During the period in which the output drive signal 104 is at logic low (e.g., "0"), the switch drive control signal generator 306 assigns all bits of the switch drive control signal 312 [4:0] to be at logic low, i.e., Bit 0=Bit 1=Bit 2=Bit 3=Bit 4="0", to turn off the switches 400, 402, 404, 406,408, respectively (see FIGS. 3 and 4).

From t5 to t6, the BJT switch 108 is effectively off with the base current $I_B$ being zero. The emitter current $I_E$ merely has a small tailing current 508.

Then, at t6, the next switching cycle occurs with the base current $I_B$ set appropriately based on the parameters (e.g., $V_{IN}$×$T_{ON}$) sensed during that next switching cycle. The base current $I_B$ set in the time periods t0 to t6 in the next switching cycle may be different from the base current $I_B$ set in the time periods t0 to t6 of the previous switching cycle shown in FIG. 5.

Figure 6:
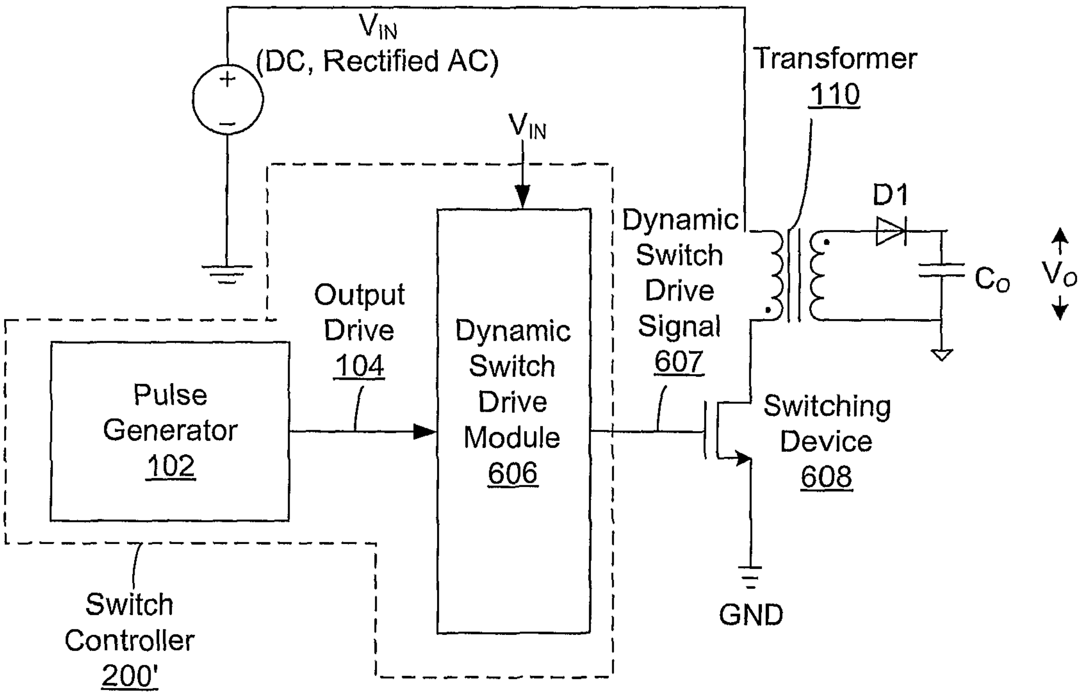
FIG. 6 conceptually illustrates a flyback type switching AC-DC power converter using a MOSFET as the switching device driven by a dynamic switch drive signal, according to another embodiment of the present invention.

FIG. 6 conceptually illustrates a flyback type switching AC-DC power converter using a MOSFET as the switching device driven by a dynamic switch drive signal, according to another embodiment of the present invention. The power converter of FIG. 6 is substantially the same as the power converter shown in FIG. 2, except that the switching device 608 is a MOSFET that is driven by a dynamic switch drive signal 607 which is a voltage signal, rather than a BJT driven by a current signal.

Figure 7:
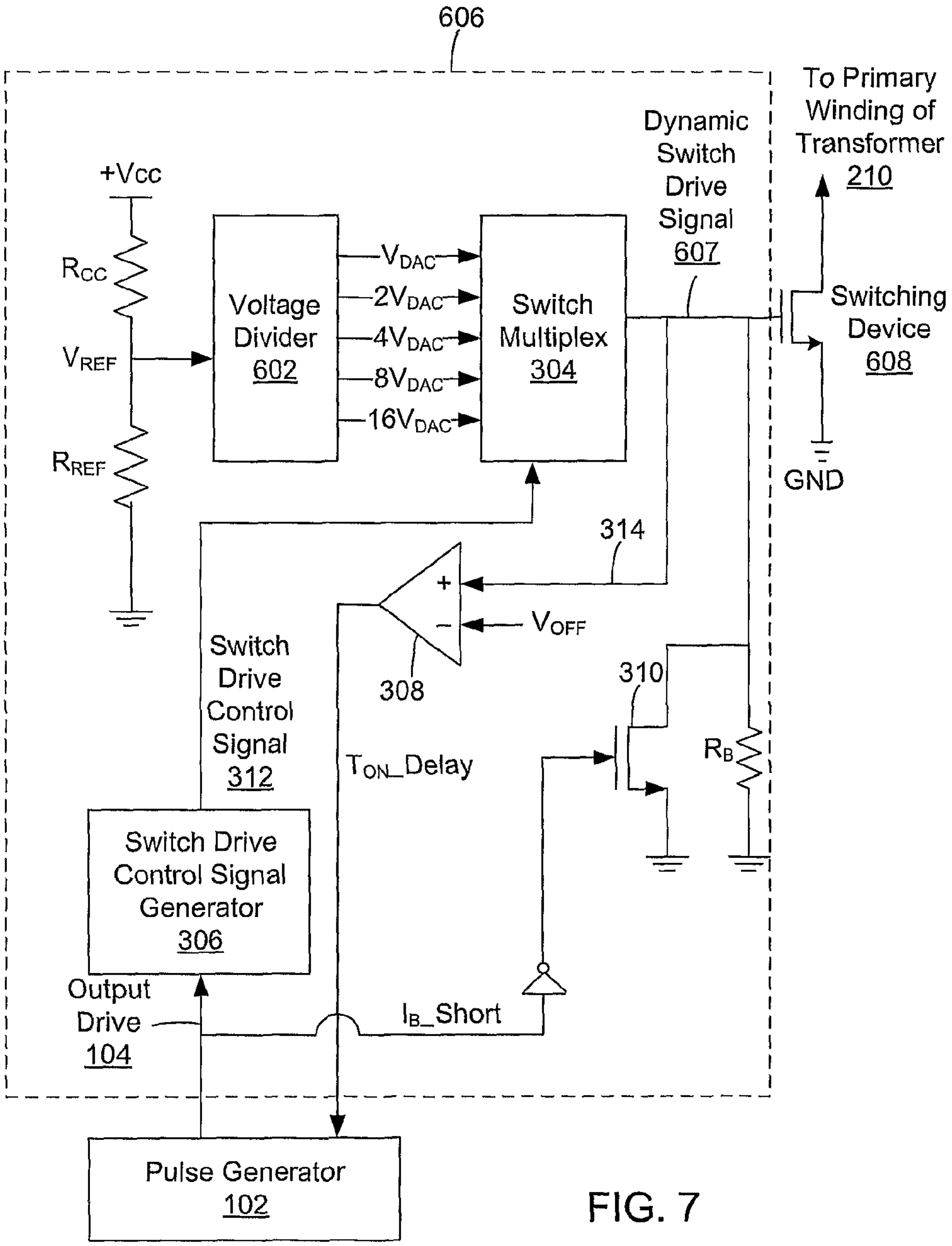
FIG. 7 illustrates the dynamic switch drive module of FIG. 6 in more detail, according to another embodiment of the present invention.

FIG. 7 illustrates the dynamic switch drive module of FIG. 6 in more detail, according to another embodiment of the present invention. The dynamic switch drive module 606 of FIG. 6 is substantially the same as the dynamic switch drive module 206 of FIG. 3, except that it includes a voltage divider 602 instead of a current mirror, and a resistor $R_{CC}$. Also, the digital switch drive control signal 312 controls the voltage DAC 604 and its output, which is the dynamic switch drive signal 607.

The reference voltage $R_{REF}$ is generated between the two resistors $R_{CC}$, $R_{REF}$. The reference voltage $V_{REF}$ is divided by a voltage divider 602 (e.g., a simple resistive divider, a capacitive divider, or an inductive divider) to generate the voltages $V_{DAC}$, $2V_{DAC}$, $4V_{DAC}$, $8V_{DAC}$, $16V_{DAC}$, which are provided as weighted inputs to the switch multiplex 304. The 5 bits of the switch drive control signal 312 are coupled to the switch multiplex 304 to pass or not pass the voltages $V_{DAC}$, $2V_{DAC}$, $4V_{DAC}$, $8V_{DAC}$, $16V_{DAC}$. Thus, the voltage of the dynamic switch drive signal 607 can be controlled in voltage form by the switch drive control signal 312. The magnitude of the dynamic switch drive signal 607 can be controlled similar to what is showed in FIG. 5. The dynamic switch drive signal 607 is controlled to drive the MOSFET switch 608 such that the gate current of the MOSFET switch 608 is substantially proportional to the drain current of the MOSFET switch 608.

Figure 8:
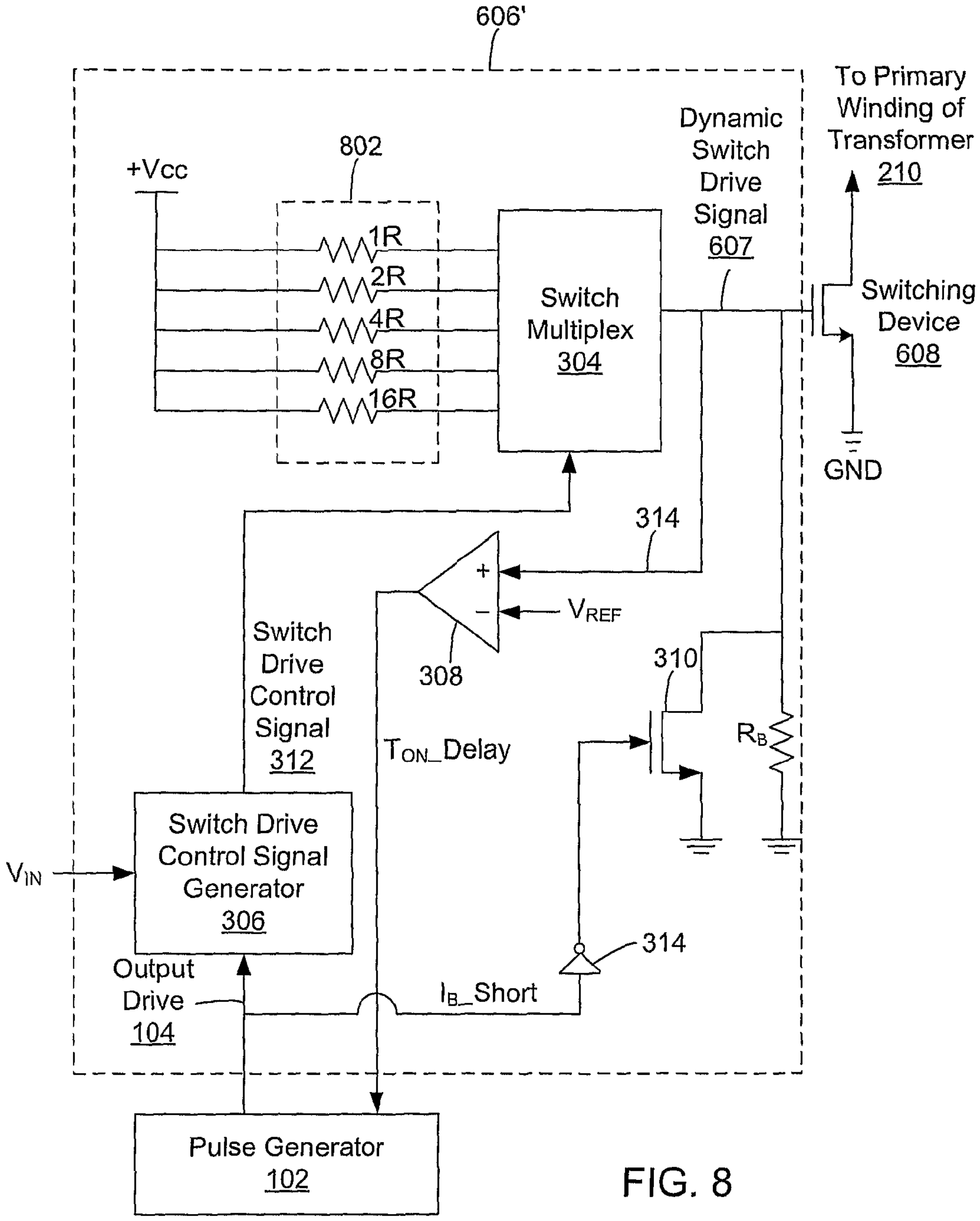
FIG. 8 illustrates the dynamic switch drive module of FIG. 6 in more detail, according to still another embodiment of the present invention.

FIG. 8 illustrates the dynamic switch drive module of FIG. 6 in more detail, according to still another embodiment of the present invention. The dynamic switch drive module 606' of FIG. 8 is substantially the same as the dynamic switch drive module 206 of FIG. 3, except that it includes a resistor network 802 comprised of resistors R, 2R, 4R,8R, 16R instead of the current mirror and the weighted currents. The resistor $R_{REF}$ is also eliminated. Also, the digital switch drive control signal 312 controls the switch multiplex 304 and its output, which is the dynamic switch drive signal 607'. In addition, the digital switch drive voltage signal 607' drives the MOSFET switch 608.

The resistors 1R, 2R, 4R, 8R ,16R are provided as weighted resistance inputs to the switch multiplex 304. The 5 bits of the switch drive control signal 312 are coupled to the switch multiplex 304 to pass or not pass the resistance 1R, 2R, 4R, 8R, 16R. Thus, the resistance coupled to the dynamic switch drive signal 607' can be controlled by the switch drive control signal 312, eventually being manifested as adjusting the magnitude of the dynamic switch drive signal 607 in voltage form. The magnitude of the dynamic switch drive signal 607 can be controlled similar to what is showed in FIG. 5. The dynamic switch drive signal 607 is controlled to drive the MOSFET switch 608 such that the gate current of the MOSFET switch 608 is substantially proportional to the drain current of the MOSFET switch 608.

As described above, the dynamic switch drive circuitry of the present invention can control the gate/base drive capability of the switching device of a switching power converter dynamically, switching cycle by switching cycle and even with a switching cycle, according to the operating load/line conditions. Since the switch drive is dynamic, the number of components and the overall cost and the physical size required for the switching power converter can be reduced significantly. Since the magnitude (amplitude) of the switch drive signal can be controlled together with the pulse width (PWM) or the pulse frequency (PFM) of the switch drive signal, the characteristics of the switching devices comes closer to an ideal switch.

Upon reading this disclosure, those of skill in the art will appreciate still additional alternative structural and functional designs for dynamically driving the switch of a switching power converter. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A switching power converter comprising:

a transformer coupled between a power source and a load;

a switch coupled to the transformer for coupling or decoupling the load to or from the power source through the transformer; and a switch controller coupled to the switch and generating a switch drive signal for turning on or off the switch during a plurality of switching cycles, the switch controller adjusting a current magnitude or a voltage magnitude of the switch drive signal within a switching cycle of the plurality of switching cycles of the switching power converter, the switching cycle comprising a first part during which the switch is turned on and a second part during which the switch is turned off, wherein the switch controller adjusts the current magnitude or the voltage magnitude from a first level to a second level and from the second level to a third level during the first part of the switching cycle, wherein the third level is less than the second level and greater than the first level.

2. The switching power converter of claim 1, wherein the switch controller includes:

a pulse generator generating an output drive signal at a first logic state during the first part of the switching cycle and a second logic state during the second part of the switching cycle; and a dynamic switch drive module receiving the output drive signal and adjusting the current magnitude or the voltage magnitude of the switch drive signal.

3. The switching power converter of claim 1, wherein the dynamic switch drive module adjusts the current magnitude or the voltage magnitude of the switch drive signal to be at the second level for a predetermined period of time at a beginning of the first part of the switching cycle.

4. The switching power converter of claim 3, wherein the predetermined period of time is fixed according to device characteristics of one or more components of the switching power converter.

5. The switching power converter of claim 1, wherein the switch is a bipolar junction transistor and the switch drive signal is a base current of the bipolar junction transistor, and the dynamic switch drive module adjusts the magnitude of the base current to be substantially proportional to a collector current of the bipolar junction transistor.

6. The switching power converter of claim 5, wherein the current magnitude of the switch drive signal is adjusted based on an input voltage to the switching power converter.

7. The switching power converter of claim 1, wherein the dynamic switch drive module adjusts the current magnitude or the voltage magnitude of the switch drive signal to be the first level for a predetermined period of time at an end of the first part of the switching cycle, wherein the first level is zero.

8. The switching power converter of claim 7, wherein the predetermined period of time during which the switch drive signal is the first level is determined based on an input voltage to the switching power converter and the load of the switching power converter.

9. The switching power converter of claim 1, wherein the dynamic switch drive module comprises:

a switch drive control signal generator generating a digital switch drive control signal that is adjusted within the switching cycle; and a switch multiplex receiving a plurality of reference current inputs and generating the switch drive signal as a current signal, the current magnitude of the switch drive current signal corresponding to a magnitude of the digital switch drive control signal.

10. The switching power converter of claim 9, wherein the plurality of reference current inputs include different weighted magnitudes of reference current.

11. The switching power converter of claim 10, wherein the plurality of reference current inputs are determined by a single resistor.

12. The switching power converter of claim 1, wherein the dynamic switch drive module comprises:

a switch drive control signal generator generating a digital switch drive control signal that is adjusted within the switching cycle; and a switch multiplex receiving a plurality of reference voltage inputs and generating the switch drive signal as a voltage signal, the magnitude of the switch drive voltage signal corresponding to a magnitude of the digital switch drive control signal.

13. The switching power converter of claim 12, wherein the plurality of reference voltage inputs include different weighted magnitudes of reference voltages.

14. The switching power converter of claim 1, wherein the dynamic switch drive module comprises:

a switch drive control signal generator generating a digital switch drive control signal that is adjusted within the switching cycle; and a switch multiplex receiving a plurality of reference resistance inputs and generating the switch drive signal as a voltage signal, the magnitude of the switch drive voltage signal corresponding to a magnitude of the digital switch drive control signal.

15. The switching power converter of claim 14, wherein the plurality of reference voltage inputs include different weighted resistances of a plurality of resistors.

16. The switching power converter of claim 1, wherein the switch is a bipolar junction transistor and the switch drive signal is a base current of the bipolar junction transistor, and the switching power converter further comprises another transistor coupled to the base of the bipolar junction transistor, said another transistor being configured to be turned on while the bipolar junction transistor is turned off to provide a discharge path for charges on the base of the bipolar junction transistor.

17. The switching power converter of claim 1, wherein the switch controller adjusts a duration during which the switch is turned on within the switching cycle in addition to adjusting the current magnitude or the voltage magnitude of the switch drive signal within the switching cycle.

18. The switching power converter of claim 1, wherein the switch controller adjusts the current magnitude or the voltage magnitude of the switch drive signal over the switching cycle and a subsequent switching cycle of the switching power converter.

19. The switching power converter of claim 1, wherein the switch is a bipolar junction transistor and the switching power converter further comprises a comparator including:

a first input receiving a base voltage at a base of the bipolar junction transistor;

a second input receiving a reference voltage corresponding to when the bipolar junction transistor is off; and an output generating an output signal based upon a comparison of the base voltage to the reference voltage, the output signal transitioning from a first logic state to a second logic state indicating when the bipolar junction transistor actually turned off.

20. A switching power converter comprising:

a transformer coupled between a power source and a load;

a switch coupled to the transformer for coupling or decoupling the load to or from the power source through the transformer; and a pulse generator generating an output drive signal for controlling on-times and off-times of the switch during a plurality of switching cycles, the output drive signal being at a first logic state during a first part of a switching cycle of the plurality of switch cycles and a second logic state during a second part of the switching cycle; and a dynamic switch drive module receiving the output drive signal and generating a switch drive signal for driving the switch based upon the output drive signal, a current magnitude or a voltage magnitude of the switch drive signal being adjusted within the switching cycle based upon an input voltage to the switching power converter and the load, wherein the dynamic switch drive module adjusts the current magnitude or the voltage magnitude from a first level to a second level and from the second level to a third level during the first part of the switching cycle, wherein the third level is less than the second level and greater than the first level.

21. The switching power converter of claim 20, wherein the dynamic switch drive module adjusts the current magnitude or the voltage magnitude of the switch drive signal to be at the second level for a predetermined period of time at a beginning of the first part of the switching cycle.

22. The switching power converter of claim 20, wherein the switch is a bipolar junction transistor and the switch drive signal is a base current of the bipolar junction transistor, and the dynamic switch drive module adjusts the magnitude of the base current to be substantially proportional to a collector current of the bipolar junction transistor.

23. The switching power converter of claim 20, wherein the dynamic switch drive module adjusts the current magnitude or voltage magnitude of the switch drive signal to be the first level for a predetermined period of time at an end of the first part of the switching cycle, wherein the first level is zero.

* * * * *